United States Patent
Deforge et al.

(10) Patent No.: US 11,067,895 B2
(45) Date of Patent: Jul. 20, 2021

(54) METHOD AND STRUCTURES FOR PERSONALIZING LITHOGRAPHY

(71) Applicant: International Business Machines Corporation, Armonk, NY (US)

(72) Inventors: John B. Deforge, Barre, VT (US); Bassem M. Hamieh, Albany, NY (US); Terence B. Hook, Jericho, VT (US); Theresa A. Newton, St. George, VT (US); Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 739 days.

(21) Appl. No.: 15/406,070

(22) Filed: Jan. 13, 2017

(65) Prior Publication Data

US 2018/0203341 A1    Jul. 19, 2018

(51) Int. Cl.
*G03F 7/20* (2006.01)
*G03F 1/70* (2012.01)

(52) U.S. Cl.
CPC .............. *G03F 7/2022* (2013.01); *G03F 1/70* (2013.01); *G03F 7/203* (2013.01); *G03F 7/70466* (2013.01)

(58) Field of Classification Search
CPC ................. G03F 7/2022; G03F 1/70
See application file for complete search history.

(56) References Cited

U.S. PATENT DOCUMENTS

| | | | |
|---|---|---|---|
| 5,308,741 A | 5/1994 | Kemp | |
| 6,383,719 B1 | 5/2002 | Bula et al. | |
| 6,942,958 B2 | 9/2005 | Chen et al. | |
| 7,519,941 B2 | 4/2009 | Bueti et al. | |
| 7,537,866 B2 | 5/2009 | King Liu | |
| 7,598,174 B1 | 10/2009 | Zhuang | |
| 7,829,266 B2 | 11/2010 | Deng et al. | |
| 7,862,986 B2 | 1/2011 | Yang | |
| 8,324,107 B2 | 12/2012 | Zhou et al. | |
| 2003/0036025 A1* | 2/2003 | Hirooka | G03F 1/00 430/394 |
| 2003/0165654 A1* | 9/2003 | Yu | G03F 1/36 428/64.1 |
| 2003/0207584 A1 | 11/2003 | Sivakumar et al. | |
| 2005/0112474 A1* | 5/2005 | Sandstrom | G03F 7/70425 430/5 |

* cited by examiner

*Primary Examiner* — Daborah Chacko-Davis
(74) *Attorney, Agent, or Firm* — Scully, Scott, Murphy & Presser, P.C.; L. Jeffrey Kelly, Esq.

(57) ABSTRACT

After printing common features from a primary mask into a photoresist layer located over a substrate, a functional feature which is suitable for changing functionalities or the configurations of the common features according to a chip design is selected from a library of additional functional features in a secondary mask. The selected functional feature from the secondary mask is printed into the photoresist layer to modify the common features that already exist in the photoresist layer. The selection and printing of functional feature processes can be repeated until a final image corresponding to the chip design is obtained in the photoresist layer.

11 Claims, 7 Drawing Sheets

METHOD AND STRUCTURES FOR PERSONALIZING LITHOGRAPHY

BACKGROUND

The present application relates to photolithography, and more particularly to low-cost photolithography using functional features in a secondary mask to customize common features already printed in a photoresist layer through a primary mask.

Lithography represents an essential technology for manufacturing integrated circuits. Lithographic techniques are used to define patterns, geometries, features, shapes, etc. on semiconductor wafers. One existing lithographic technique is photolithography, in which images defined by lithographic masks are printed onto the semiconductor wafers. Unfortunately, it is increasingly expensive to design and manufacture masks with the advancement of integrated circuit technology. Whenever a design modification is required (e.g., when changing connections so as to affect functionality of chips, enabling different configurations of cores or fixing design or mask errors), a new set of masks must be generated, resulting in increased cost and development cycle time. Therefore, it is desirable to be able to directly write a pattern in post-mask development.

SUMMARY

The present application provides a method that allows obtaining different functionalities or configurations on a chip using photolithography in post-mask development by supplying a secondary mask with additional functional features. After printing common features from a primary mask into a photoresist layer located over a substrate, a functional feature, which is suitable for changing functionalities or the configurations of the common features according to a chip design, is selected from a library of additional functional features in a secondary mask. The selected functional feature from the secondary mask is printed into the photoresist layer to modify the common features that already exist in the photoresist layer. The selection and printing of functional feature processes can be repeated until a final image corresponding to the chip design is obtained in the photoresist layer.

In one aspect of the present application, a method of printing a pattern in a substrate is provided. In one embodiment, the method includes first providing a primary mask comprising common features of a chip at a given mask level. A photoresist layer located on the substrate is then exposed through the primary mask to print the common features in the photoresist layer. Next, a secondary mask including a library of functional features for personalizing the common features in the photoresist layer at the given mask level according to a chip design is provided. After selecting a functional feature in the library of the functional features of the secondary mask to modify at least one common feature in the photoresist layer, the photoresist layer is exposed through the secondary mask to print the selected functional feature in the photoresist layer.

In another embodiment, the method includes first providing a primary mask comprising common features of a chip at a given mask level. A photoresist layer located on the substrate is then exposed through the primary mask to print the common features in the photoresist layer. Next, a secondary mask including an entirety of functional features required to customize the common features in the photoresist layer at the given mask layer according to a chip design is provided. The photoresist layer is exposed through the secondary mask to print the entirety of the function features in the photoresist layer.

DETAILED DESCRIPTION

Figure 2:
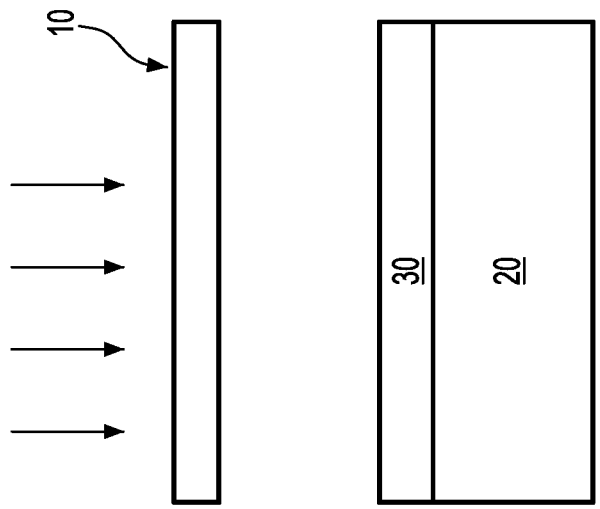
FIG. 2 is a cross-sectional view of an exemplary structure after positioning the primary mask over a substrate having a photoresist layer formed thereon.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
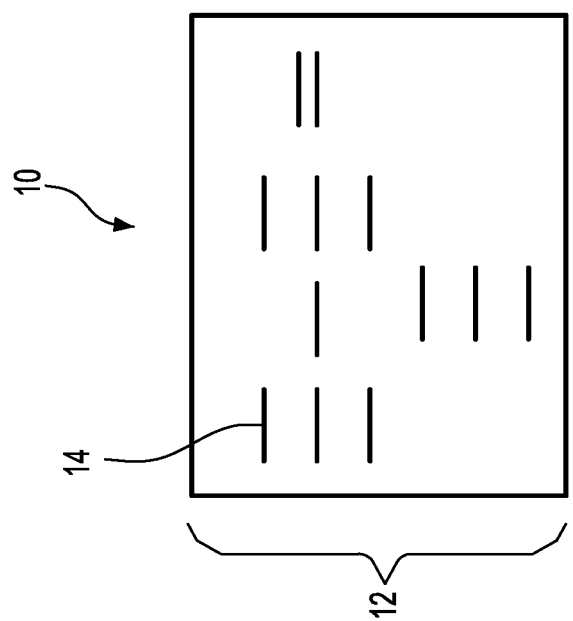
FIG. 1 is a top view of an exemplary primary mask that can be employed in embodiments of the present application.

Referring to FIG. 1, there is illustrated an exemplary primary mask 10 that can be employed in embodiments of the present application. The primary mask 10 contains a first pattern 12 of common features 14 for printing a generalized structure at a given mask level. In one embodiment and as shown in FIG. 1, the primary mask 10 contains a plurality of horizontal line features 14.

Referring to FIG. 2, the primary mask 10 is positioned over a substrate 20 having a photoresist layer 30 formed thereon. The substrate 20 is a portion of a semiconductor wafer, on which semiconductor devices are fabricated (not shown). The semiconductor devices fabricated on the substrate 20 can be discrete devices such as field effect transistor (FET), diodes, resistors, capacitors, and inductors or an integrated circuit including a combination of various semiconductor devices. The substrate 20 may, or may not, include at least one metal interconnect structure such as a dielectric layer embedding metal lines, metal vias, or a combination thereof.

The photoresist layer 30 may include a positive resist material or a negative resist material. A positive resist material, when exposed to radiation becomes more soluble and is thus more easily removed in a development process. As a result, a developed positive resist contains a resist pattern corresponding to the dark regions on a mask. A negative resist material, in contrast, becomes less soluble when exposed to radiation. Consequently, a developed negative resist contains a pattern corresponding to the transparent regions of a mask. The photoresist layer 30 may be formed, for example, by spin coating. The thickness of the photoresist layer 30 may be from 30 nm to 1,000 nm, although lesser and greater thicknesses area also contemplated herein.

Figure 3:
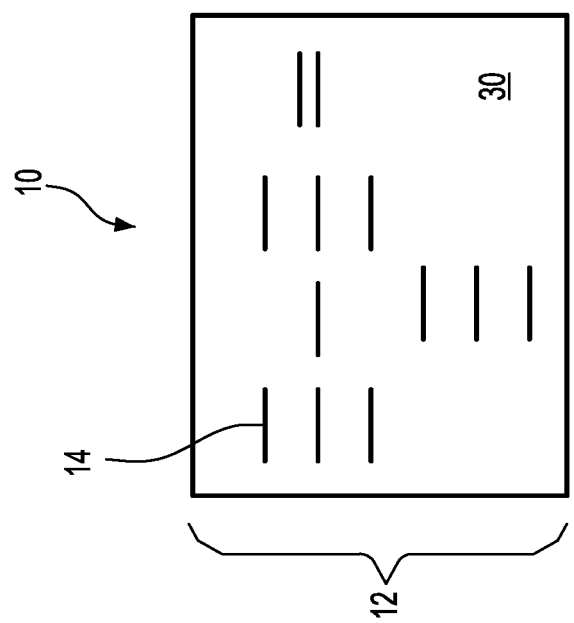
FIG. 3 is a top view of the exemplary structure after printing common features in the primary mask in the photoresist layer.

A first photolithography process is performed by exposing the photoresist layer 30 using the primary mask 10 to a first radiation. As a result and as shown in FIG. 3, the first pattern 12 of common features 14 is transferred to the photoresist layer 30.

Figure 4:
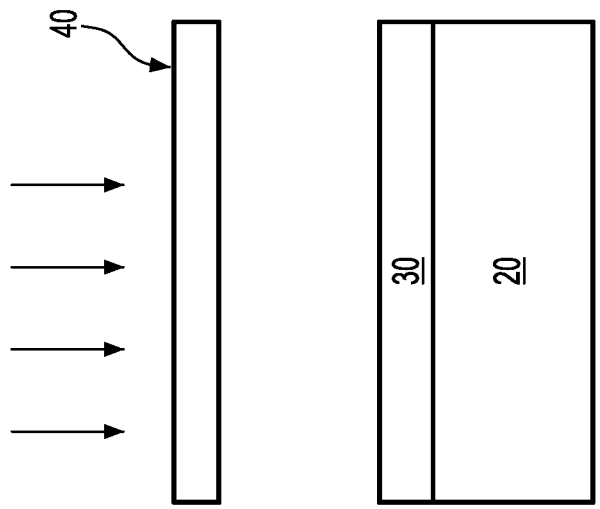
FIG. 4 is a cross-sectional view of the exemplary structure after positioning a secondary mask over the photoresist layer.

Referring to FIG. 4, once the common features 14 are printed in the photoresist layer 30, the photoresist layer 30 is exposed to a second radiation through a secondary mask 40 positioned over the photoresist layer 30. The secondary mask 40 contains additional functional features for modifying common features that already exist in the photoresist layer 30 (not shown) so as to obtain different functionalities or configurations in chips.

Figure 5:
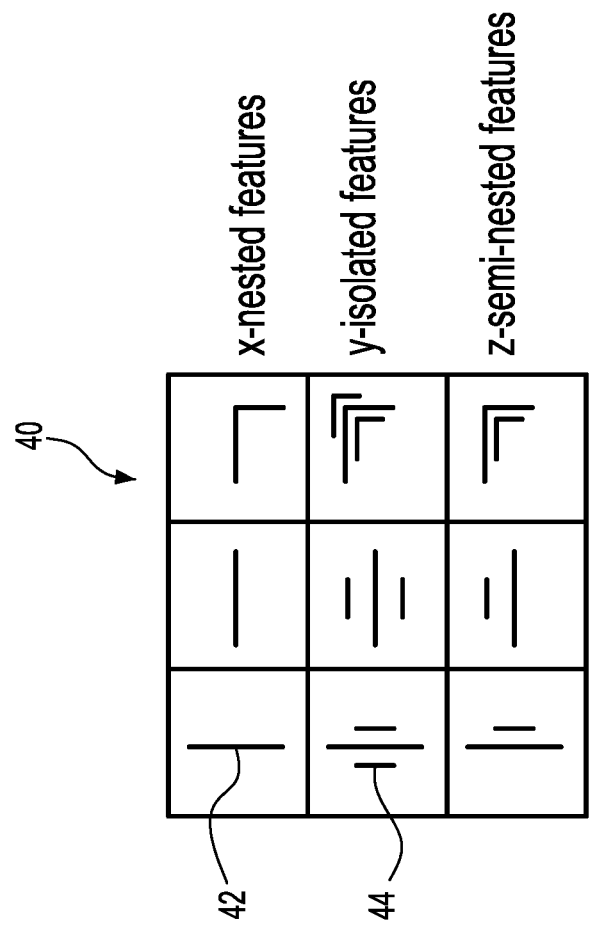
FIG. 5 is a top view of an exemplary secondary mask containing a library of functional features for personalizing the common features in the photoresist layer according to a first embodiment of the present application.

Referring to FIG. 5, there is illustrated an exemplary secondary mask 40 that can be employed according to a first embodiment of the present application. The secondary mask 40 may include a library of additional functional features 42 for modifying the common features that already exist in the photoresist layer 30. As shown, the functional features 42 can be vertical line features, horizontal line features or L-shaped features. Although three shapes have been shown, it should be understood that there is no limitation on the shapes of these functional features 42. As shown in FIG. 5, some functional features 42 are optimized with sub-resolution assist (SRA) features 44 for optical proximity correction (OPC). The OPC is chosen based on the environment from the primary mask 10, given that the photoresist layer 30 has already undergone some level of exposure during the first lithography step. In one embodiment and as shown, the functional features 42 of the secondary mask 40 are arranged in a matrix of rows and columns with nested features situated in a first row (x), isolated features situated in a second row (y) and semi-nested features situated in a third row (z). The nested features are those functional features 42 which do not need any SRA features 44 for proper printing. The isolated features are those functional features 42 having a SRA feature on each side to ensure proper printing. The semi-isolated features are those functional features 42 having a SRA feature on single side to ensure proper printing. Although a 3×3 matrix has been shown, it should be understood that a matrix of any number of rows and columns may be constructed in this fashion.

Figure 6:
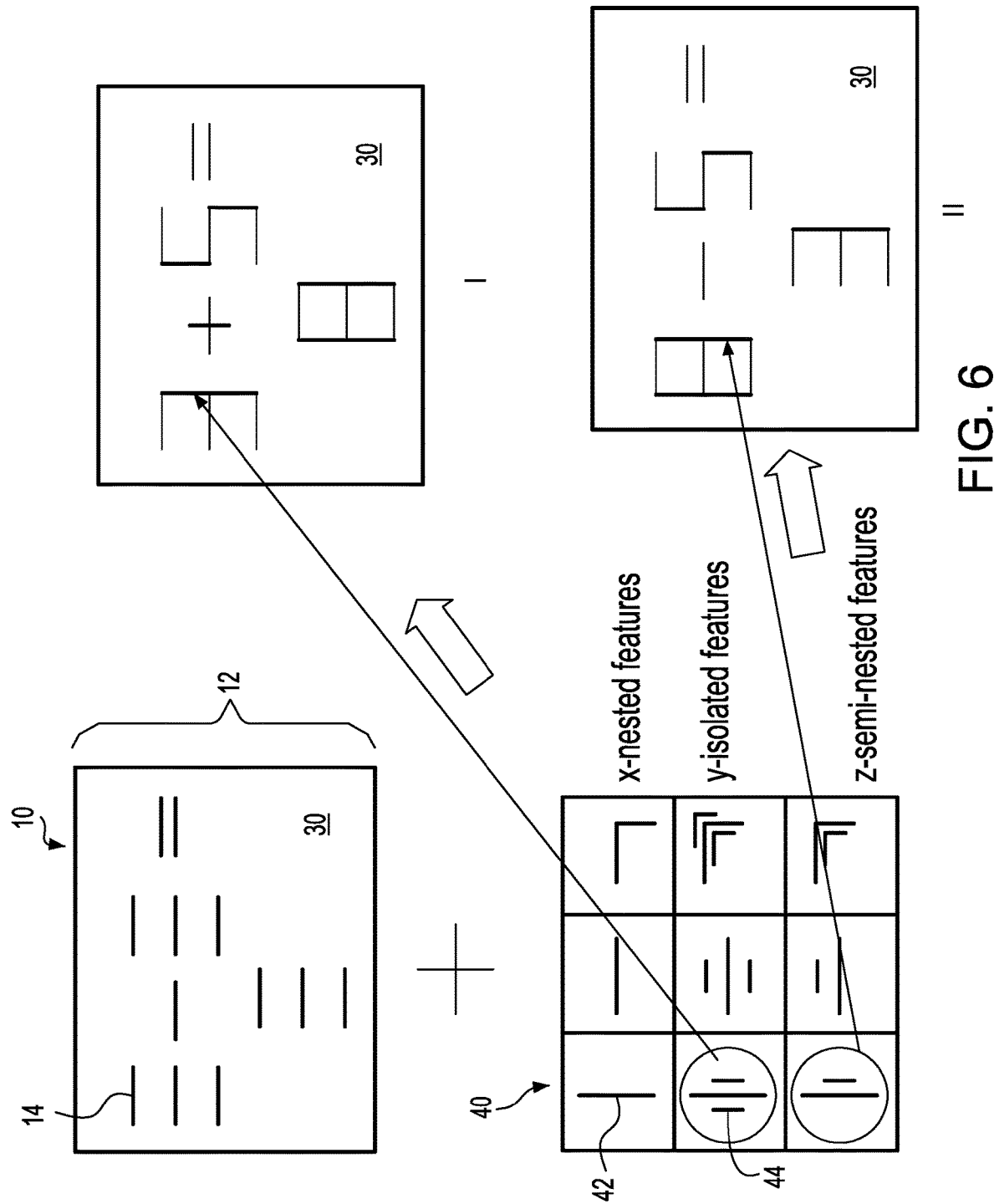
FIG. 6 illustrates processes for personalizing the common feature in the photoresist layer using suitable functional features from the secondary mask according to the first embodiment of the present application.

In the first embodiment of the present application, using a secondary mask 40 having a library of optimized functional features 142 would allow an infinite number of variations of features of the primary mask 10 to be printed in the photoresist layer 30, thus providing a great flexibility in changing functionalities or configurations of final chips. For example, different types of the functional features 42 in the secondary mask 40 can be employed for connecting common features 14 where desired to obtain different functionalities/configurations in the final chips. As shown in FIG. 5, an isolated vertical line feature in the second row (y) of the matrix may be chosen to form a subset structure ∃ having an isolated nature, while a semi-nested vertical line feature in the third row (z) of the matrix may be chosen to form another subset structure ⊟ having a half-isolated nature. In addition, different types of the functional features 42 in the secondary mask 40 can be employed for obtaining same functionality in a subset structure. For example, the subset structure ∃ can be formed by employing a fully nested vertical line feature in the first row (x) of the matrix, a fully isolated vertical line feature in the second row (y) or a semi-nested vertical line feature in the third row (z) depending on the level of the exposure of the photoresist layer 30. Note that the formation of a final image I or II in the photoresist layer 30 as shown in FIG. 6 requires a multi-step exposure process, with each partition step requiring the selection a suitable functional feature 42 from the functional feature library in the secondary mask 40 and placement the selected functional feature 42 onto the target common feature 12 to obtain a subset structure. Only the selected section in the secondary mask 40 is exposed to the radiation during the second lithography process.

Figure 7:
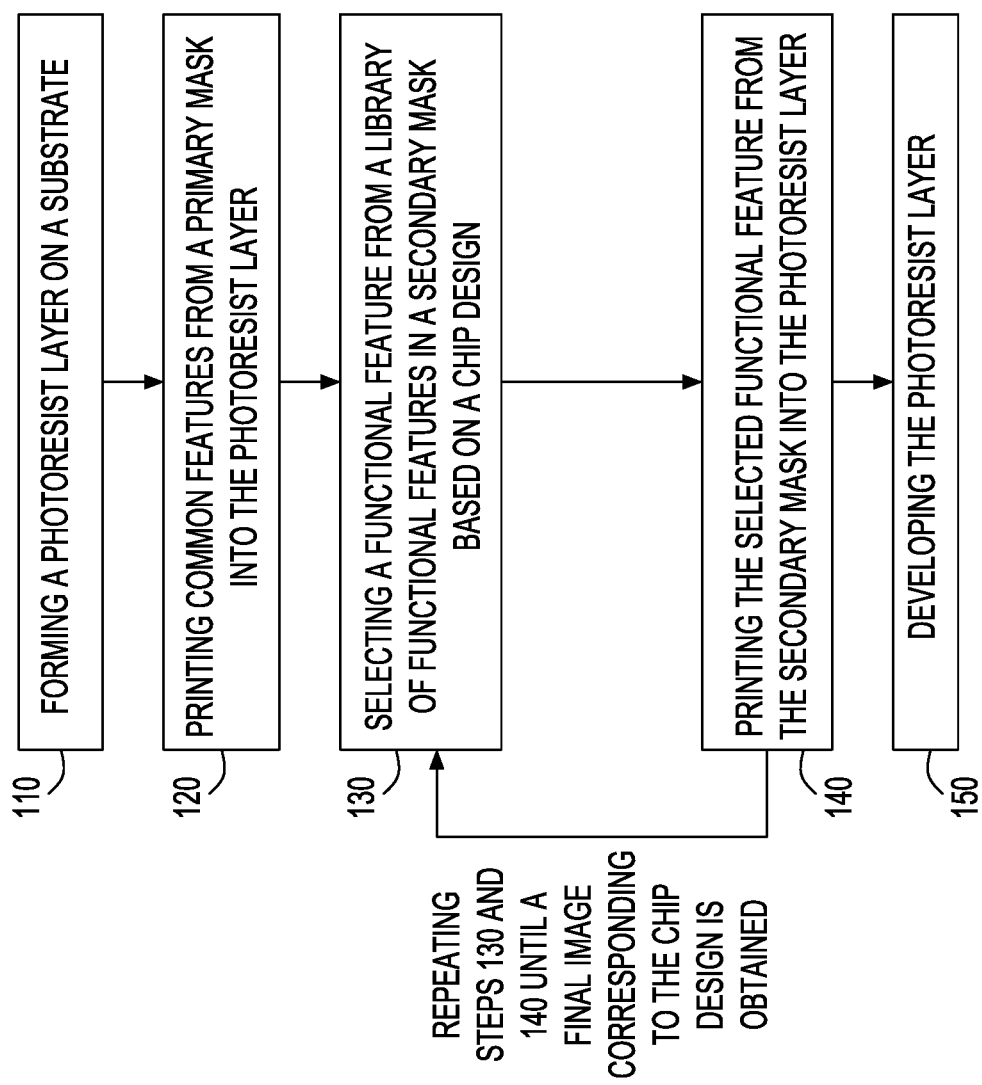
FIG. 7 is a block diagram illustrating a process for making the common features using the primary mask at a given mask layer and subsequently modifying the common feature with suitable functional features from the secondary mask according to the first embodiment of the present application.

FIG. 7 presents a block diagram illustrating a process for making common features 14 using a primary mask 10 at a given mask layer and subsequently modifying the common features 14 with suitable functional features 42 from a secondary mask 40 according to the first embodiment of the present application. At step 110, a photoresist layer is formed on a substrate. At step 120, common features from a primary mask are printed into the photoresist layer. At step 130, a functional feature from a library of functional features in a secondary mask is selected based on a chip design. At step 140, the selected functional feature from the secondary mask is printed into the photoresist layer. The selected functional feature either connects adjacent common features or intersects with one of the common features. Steps 130 and 140 may be repeated until a final image corresponding to the chip design is obtained. At step 150, the photoresist layer is developed.

Figure 8:
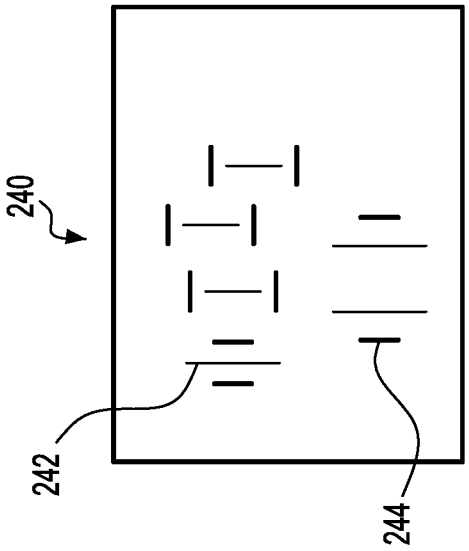
FIG. 8 is a top view of an exemplary secondary mask containing all the functional features for customizing the common features in the photoresist layer according to a second embodiment of the present application.

Referring to FIG. 8, there is illustrated an exemplary secondary mask 240 that can be employed according to a second embodiment of the present application. The secondary mask 240 may include all the additional functional features 242 that are required to customize the given mask level. The functional features 242 in the secondary mask 240 either connect adjacent common features 14 or intersect common features 14 in the primary mask 10. The functional features 242 in the secondary mask 240 are optimized with SRA features 244 for OPC. The OPC is chosen based on the overlap of common features 14 in the primary mask 10 and the functional features in secondary mask 240 as well as the environment from the primary mask 10 given that the resist layer 30 has already been undergone some level of exposure during the first lithographic step. With a single full chip exposure, the additional functional features 242 in the secondary mask 240 can be transferred into the photoresist layer 30.

Figure 9:
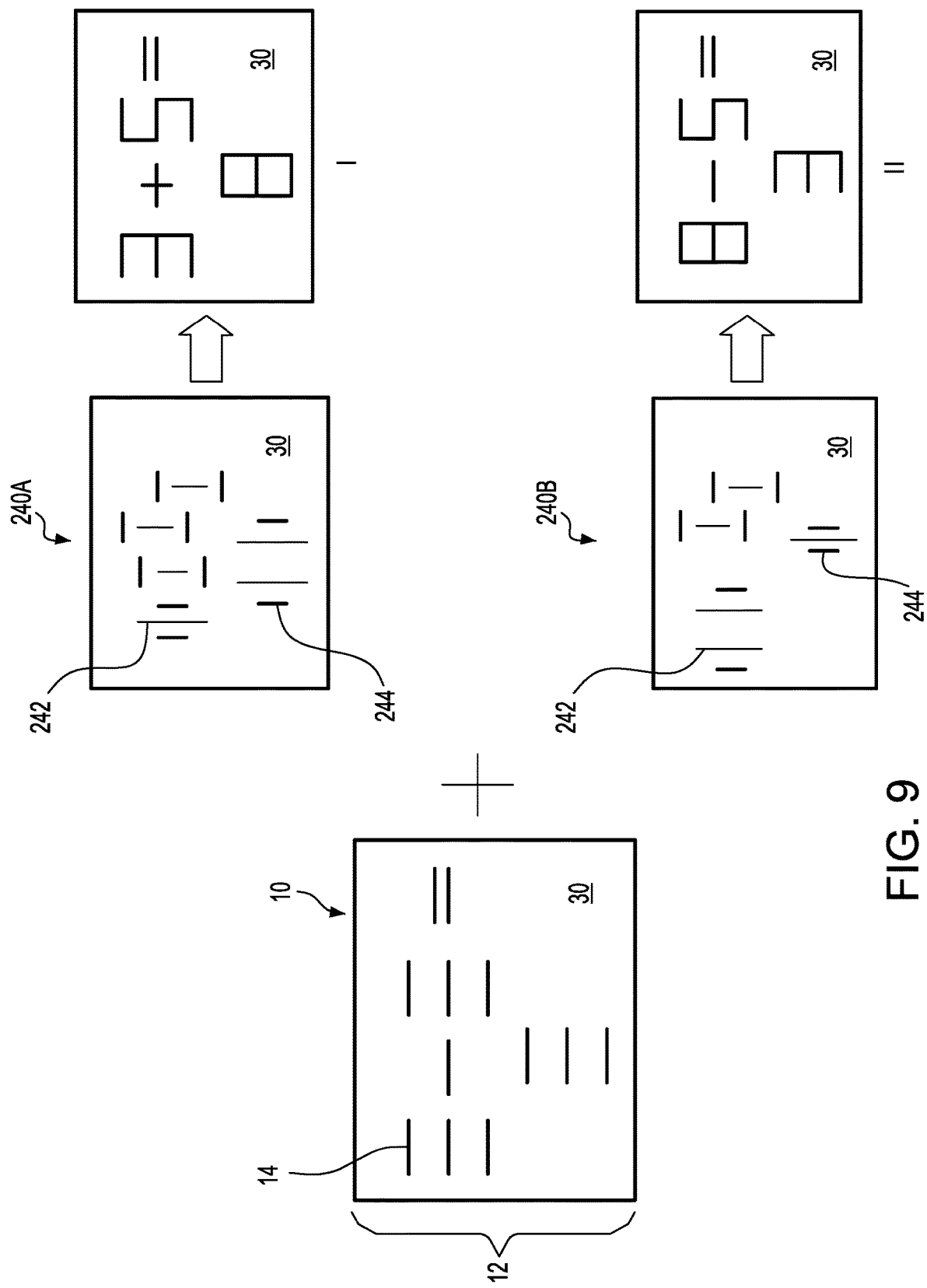
FIG. 9 illustrates processes for customizing the common features in the photoresist layer using the functional features from the secondary mask according to the second embodiment of the present application.

In the second embodiment of the present application, all the additional functional features 242 are included on a single mask (i.e., secondary mask 40). The mask design is useful when making two chips with only minor functional differences from each other (e.g., first final image I and second final mage II shown in FIG. 9). As shown in FIG. 9, the top secondary mask 140A can be employed along with the primary mask 10 to make the first final image I in the photoresist layer 30, while the bottom secondary mask 140B can be employed along with the primary mask 10 to make the second final image II in the photoresist layer 30. Thus by simply changing the secondary mask alone, the functionalities of the chips can be altered in a cost effective way comparing to the prior art method in which a completely new mask needs to be made once functionalities or configurations of a chip are changed no matter how minor the change may be.

After the additional functional features 42, 242 in the secondary mask 40, 240 are transferred in the photoresist layer 30, the photoresist layer 30 can be developed using conventional resist development processing (not shown). In a positive-development process, the exposed potions of the photoresist layer 30 may be removed by the development, while in a negative-development process, the unexposed portions of the photoresist layer 30 may be removed by the development.

Figure 10:
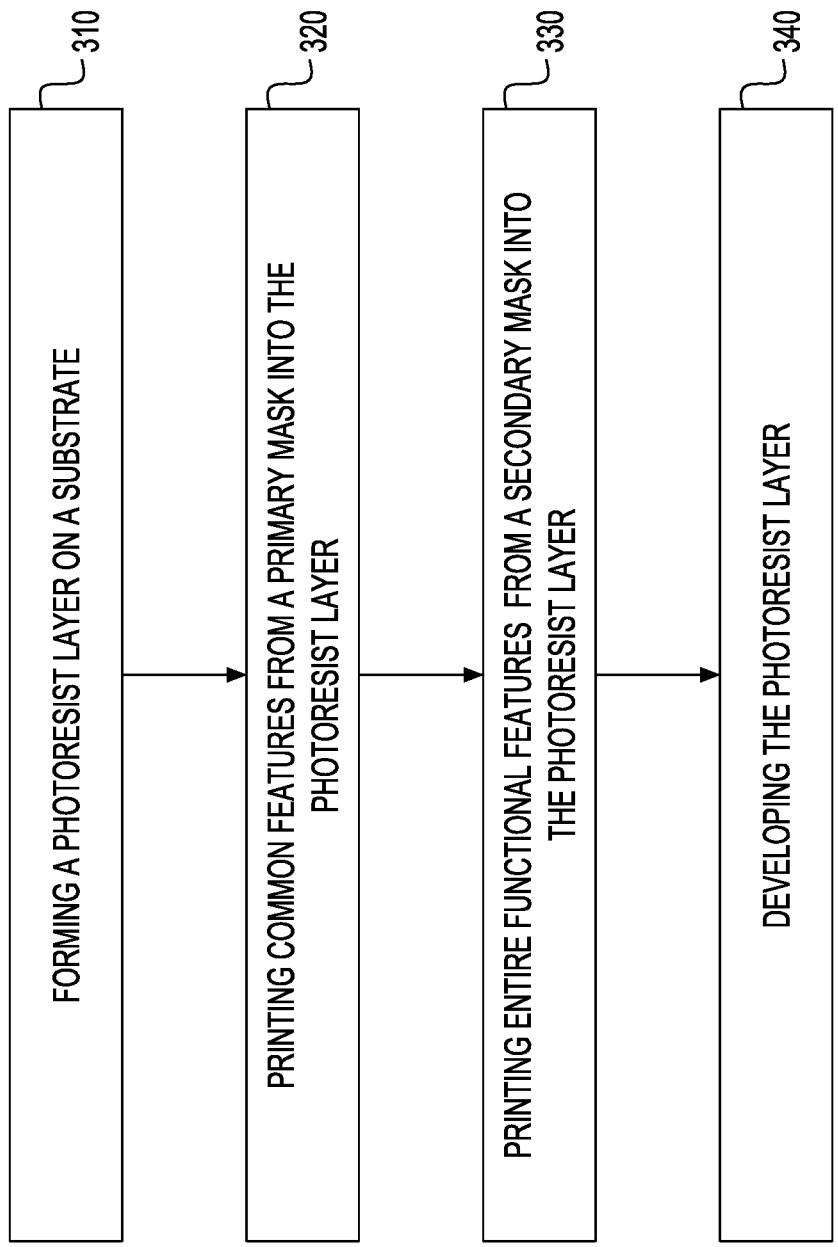
FIG. 10 is a block diagram illustrating a process for making the common features using the primary mask at a given mask layer and subsequently modifying the common features with functional features from the secondary mask according to the second embodiment of the present application.

FIG. 10 presents a block diagram illustrating a process for making common features 14 using a primary mask 10 at a given mask level and subsequently modifying the common features 14 with additional functional features 242 from a secondary mask 240 according to the second embodiment of the present application. At step 310, a photoresist layer is formed on a substrate. At step 320, common features from a primary mask are printed into the photoresist layer. At step 330, entire functional features from the secondary mask are printed into the photoresist layer. The selected functional features either connect adjacent common features or intersect with the common features. At step 340, the photoresist layer is developed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method for printing a pattern on a substrate comprising:
   providing a primary mask comprising a plurality of common features of a chip at a given mask level;
   exposing a photoresist layer located on the substrate through the primary mask to print the plurality of common features in the photoresist layer;
   providing a secondary mask comprising a library of different and selectable functional features for modifying selected common features of the plurality of common features printed in the photoresist layer at the given mask level according to a chip design;
   first selecting a first functional feature in the library of the functional features of the secondary mask;
   first exposing the photoresist layer through the secondary mask to print the first selected functional feature in the photoresist layer and to modify a functionality or configuration of at least one first common feature of the plurality of common features printed in the photoresist layer into at least one first new feature comprising a combination of the least one first common feature and the first selected functional feature;
   second selecting, utilizing the same secondary mask as used during the first selecting and first exposing, a second functional feature in the library of the functional features of the secondary mask according to the chip design; and
   second exposing the photoresist layer through the secondary mask to print the second selected functional feature in the photoresist layer and to modify a functionality or configuration of at least one second common feature of the plurality of common features printed in the photoresist layer into a second new feature comprising a combination of the least one second common feature and the second selected functional feature.

2. The method of claim 1, further comprising:
   repeating additional steps of selecting and exposing utilizing the same secondary mask as the first and second selecting and exposing until personalized features according to the chip design are formed in the photoresist layer.

3. The method of claim 2, further comprising developing the photoresist layer after the personalized features are formed in the photoresist layer.

4. The method of claim 1, wherein the secondary mask further comprises sub-resolution assist (SRA) features alongside some of the functional features in the library for optical proximity correction (OPC).

5. The method of claim 4, wherein the OPC is chosen based on an environment of the primary mask.

6. The method of claim 4, wherein a first set of the functional features in the secondary mask is a nested feature set within which no SRA features are formed around each of the functional features, a second set of the functional features in the secondary mask is an isolated feature set within which each of the functional features has a SRA feature formed on each side thereof, and a third set of the functional features in the secondary mask is a semi-nested feature set within which each of the functional features has a SRA feature formed on a single side thereof.

7. The method of claim 1, wherein the functional features in the secondary mask are arranged in a matrix of rows and columns.

8. The method of claim 7, wherein the functional features in the secondary mask comprise vertical line features, horizontal line features or L-shaped line features.

9. The method of claim 1, wherein the selected first functional feature connects adjacent first common features printed in the photoresist layer.

10. The method of claim 1, wherein the selected first functional feature intersects first common features printed in the photoresist layer.

11. The method of claim 1, wherein the first exposing the photoresist layer through the secondary mask exposes a section of the secondary mask where the selected first functional feature is located, and the second exposing the photoresist layer through the secondary mask exposes another section of the secondary mask where the selected second functional feature is located.

\* \* \* \* \*